(12) United States Patent
Yamada

(10) Patent No.: US 6,169,774 B1
(45) Date of Patent: Jan. 2, 2001

(54) PHASE COMPARATOR FOR DETERMINING IN WHICH DIRECTION THE PHASE OF A SIGNAL CHANGES ON THE BASIS OF A ROTARY VECTOR

(75) Inventor: Susumu Yamada, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/275,050

(22) Filed: Mar. 24, 1999

(30) Foreign Application Priority Data

Mar. 25, 1998 (JP) .................................................. 10-096823

(51) Int. Cl.$^7$ ...................................................... H03D 3/24
(52) U.S. Cl. ............................. 375/375; 375/376; 327/147
(58) Field of Search ..................................... 375/375, 376, 375/374; 327/156, 158, 147, 148, 149, 5

(56) References Cited

U.S. PATENT DOCUMENTS

| | | | |
|---|---|---|---|
| 5,430,773 | * | 7/1995 | Marbot .................................. 375/373 |
| 5,548,235 | * | 8/1996 | Marbot .................................. 327/158 |
| 5,877,641 | * | 3/1999 | Ziegler et al. ......................... 327/156 |

OTHER PUBLICATIONS

U.S. Patent Application No. 08/714,269 (Nobusuke Yamaoka et al.).

* cited by examiner

*Primary Examiner*—Temesghen Ghebretinsae
(74) *Attorney, Agent, or Firm*—Venable; Robert J. Frank; Michael A. Sartori

(57) ABSTRACT

A phase comparator compares the phase of a subject signal with that of a reference signal to produce a result therefrom. The subject signal is shifted in phase by $\pi/4$ and $-\pi/4$, separately. The two phase-shifted signals are respectively compared in phase with a reference signal. Resultant, two phase difference signals are applied to a decision circuit, which is operative on the basis of a rotary vector defined by the phase difference signals. The decision circuit determines the phase difference $\alpha$ and whether the phase of the subject signal changes in one direction in which the phase difference increases or in the opposite direction in which the difference decreases. A reversible counter is responsive to the decision circuit to increment or decrement its count accordingly. That allows the phase difference to be measured over many periods of the subject signals without requiring a frequency divider dividing the subject and reference signals.

9 Claims, 11 Drawing Sheets

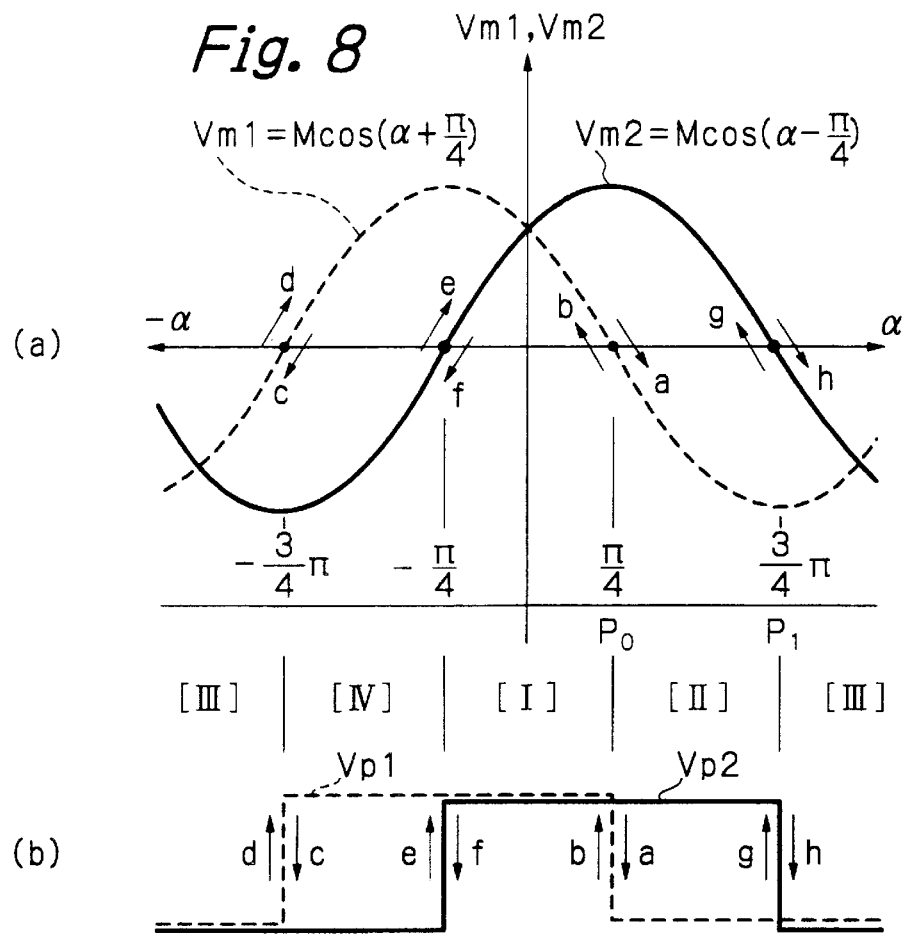
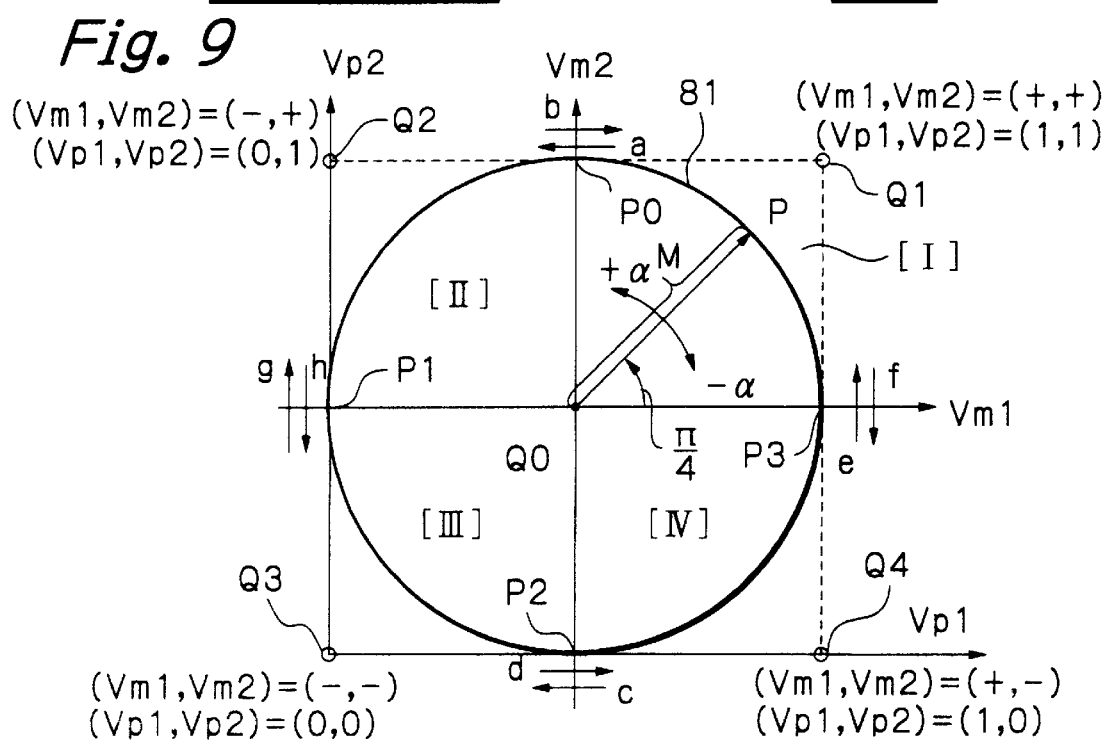

Fig. 12

| CURRENT STATE | | | PREVIOUS STATE | | | UP | DOWN | ERROR |
|---|---|---|---|---|---|---|---|---|
| Vp1 | Vp2 | QUADRANT | vp1 | vp2 | QUADRANT | | | |
| 1 | 1 | I | 1 | 1 | I | 0 | 0 | 0 |
| 0 | 1 | II | 1 | 1 | I | 1 | 0 | 0 |
| 0 | 0 | III | 1 | 1 | I | 0 | 0 | 1 |
| 1 | 0 | IV | 1 | 1 | I | 0 | 1 | 0 |
| 1 | 1 | I | 0 | 1 | II | 0 | 1 | 0 |
| 0 | 1 | II | 0 | 1 | II | 0 | 0 | 0 |
| 0 | 0 | III | 0 | 1 | II | 1 | 0 | 0 |
| 1 | 0 | IV | 0 | 1 | II | 0 | 0 | 1 |
| 1 | 1 | I | 0 | 0 | III | 0 | 0 | 1 |
| 0 | 1 | II | 0 | 0 | III | 0 | 0 | 0 |
| 0 | 0 | III | 0 | 0 | III | 0 | 0 | 0 |
| 1 | 0 | IV | 0 | 0 | III | 1 | 0 | 0 |
| 1 | 1 | I | 1 | 0 | IV | 1 | 0 | 0 |
| 0 | 1 | II | 1 | 0 | IV | 0 | 0 | 1 |
| 0 | 0 | III | 1 | 0 | IV | 0 | 1 | 0 |
| 1 | 0 | IV | 1 | 0 | IV | 0 | 0 | 0 |

PHASE COMPARATOR FOR DETERMINING IN WHICH DIRECTION THE PHASE OF A SIGNAL CHANGES ON THE BASIS OF A ROTARY VECTOR

BACKGROUND OF THE INVENTION

1. Field of the Invention

The present invention relates to a phase comparator advantageously for use in phase-locked loops.

2. Description of the Background Art

As well known in the art, the phase comparator, particularly for use in the phase-locked loop (PLL), is one of the most important electronics components which are employed in a greater amount in the electronics appliances, such as telecommunications devices. For telecommunications devices, crystal oscillators were traditionally used in order to accurately control the frequency and the phase of signals to be transmitted and received. The tendency of designing increasing channels to be multiplexed for transmission caused the crystal oscillators to be increased included in the telecommunications devices, thus giving rise to increasing the mass and the cost of the devices.

The difficulties described above were overcome by the PLL circuits. As known, the PLL circuit includes, in addition to a crystal oscillator, a self-controlled, own oscillator for generating a reference freqeuency. The phase comparator is one of the constituent components forming the PLL loop, and adapted to determine the phase difference of the signal generated by the PLL loop from a reference signal generated by the crystal oscillator. In response to the phase difference determined, controlled are the frequency and the phase of the signal generated by the PLL loop. Under the locked condition, namely, the accurately controlled condition, from the output of the PLL loop, obtained is a signal which precisely follows the reference signal which the crystal oscillator stably generates.

With the PLL circuits including the conventional phase comparator involve the problem to be solved which is caused by the phase comparison range within which the phase comparator is adapted to compare the phases between a reference signal and an oscillating signal. More specifically, the phase comparison range is in principle restricted within the period of one cycle of the oscillating signal, so that an abrupt increase of the oscillating frequency does not allow the PLL circuit to follow the corresponding phase difference. The problem has been overcome by designing the PLL loop such that the oscillating frequency to be compared is divided into a lower frequency, which is in turn compared with a reference frequency. That caused the circuitry for frequency divider to be more bulky and consume more electric power.

An example of the PLL circuit including such a frequency divider is described in co-pending U.S. patent application Ser. No. 08/714,269 assigned to the same assignee as that of the present invention. The U.S. application discloses bit phase synchronizing circuitry which includes a timing decision circuit for receiving data with an unknown phase and triphase clocks generated from a reset voltage-controlled oscillator (VCO). If preselected one of the triphase clocks and the received data have an adequate relation therebetween, then the decision circuit causes the current clock phase to be maintained, or, otherwise, determines whether the current clock phase should be advanced or restarted. Outputs from a multiplication PLL circuit are selectablly supplied to the reset VCO in response to the decision circuit. The decision circuit latches the received data with the preselected one triphase clock and produces the data together with the clock used for latching. A phase control causes the reset VCO to selectively operate in a phase shift mode or in a multiplication PLL mode. That causes bit phase synchronization to be set up stably.

SUMMARY OF THE INVENTION

It is therefore an object of the present invention to provide a phase comparator which allows a phase-locked loop to be locked even with an abrupt change over a period of time exceeding one cycle of an oscillating frequency without increasing a substantive amount of circuitry.

In accordance with the present invention, a phase comparator for comparing a phase of a subject signal with a phase of a reference signal for producing a result signal representative of a result therefrom, comprising: a first phase shifter for advancing the phase of the subject signal by a predetermined angle to produce a first signal, the predetermined angle being substantially equal to $\pi/4$; a second phase shifter for delaying the phase of the subject signal by the predetermined angle to produce a second signal; a first phase comparator circuit for comparing a phase of the first signal with the phase of the reference signal during a plurality of periods of the reference signal or the first signal to obtain a phase difference in each of the plurality of periods to produce a first phase difference signal representative of the phase difference obtained; a second phase comparator circuit for comparing a phase of the second signal with the phase of the reference signal during a plurality of periods of the reference signal or the second signal to obtain a phase difference in each of the plurality of periods to produce a second phase difference signal representative of the phase difference obtained; a decision circuit operative in response to the first and second phase difference signals for determining whether the phase of the subject signal changes in a first direction in which the phase difference increases or in a second direction in which the phase difference decreases; and a reversible counter operative in response to said decision circuit for incrementing or decrementing a count to produce the result signal corresponding to the count.

BRIEF DESCRIPTION OF THE DRAWINGS

The objects and features of the present invention will become more apparent from consideration of the following detailed description taken in conjunction with the accompanying drawings in which:

FIG. 8 shows in part (a) an example of an analog waveform of the output voltage from the lowpass filter, and in part (b) digital pulses of the output voltage from the pulse shapers, useful for understanding a decision made by the decision circuit shown in FIG. 5;

FIG. 9 shows a rotary vector formed by the output voltages from the lowpass filters, like FIG. 6, and the conditions of the digital pulses developed from the pulse shapers, useful for understanding a decision made by the decision circuit shown in FIG. 5;

FIG. 12 shows a logic table useful for understanding a decision made by the specific embodiment of the decision circuit shown in FIG. 11;

FIGS. 13A, 13B and 13C show examples of the Karnaugh maps useful for understanding a designing of the decision circuit shown in FIG. 11.

DESCRIPTION OF THE PREFERRED EMBODIMENT

Figure 1:
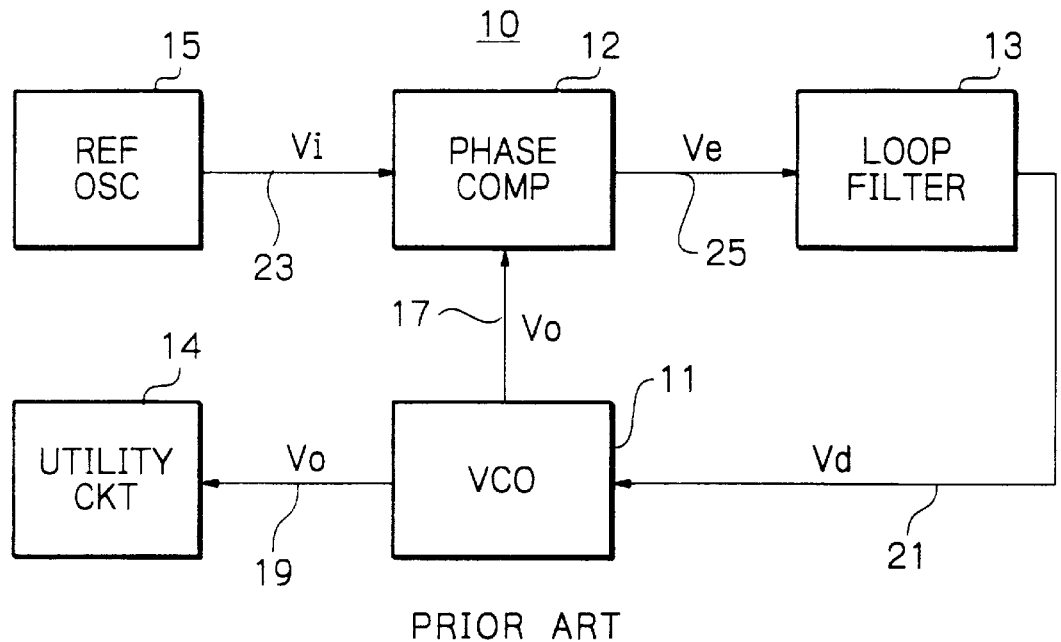
FIG. 1 shows in a sechematic block diagram a conventional PLL circuit.

Prior to describing a preferred embodiment of the invention, a brief description will be made on the phase-locked loop (PLL) to which a phase comparator in accordance with the present invention is advantageously applicable, with reference to FIG. 1. A phase-locked loop, generally designated with a reference numeral 10, comprises a voltage-controlled oscillator (VCO) 11, a phase comparator 12 and a reference oscillator 15, which are interconnected as shown in FIG. 1. The voltage-controlled oscillator 11 is a self-running oscillator adapted to produce on its outputs 17 and 19 an oscillating frequency, which is controlled in dependent upon a control voltage Vd provided from the output 21 of the loop filter 13. The voltage-controlled oscillator 11 produces an output voltage Vo on its outputs 17 and 19 which are interconnected, as depicted, to a utility circuit 14 and the phase comparator 12, respectively. The output voltage Vo will sometimes be referred to as a voltage to be controlled or a subjcet signal, hereinafter.

Figure 2:
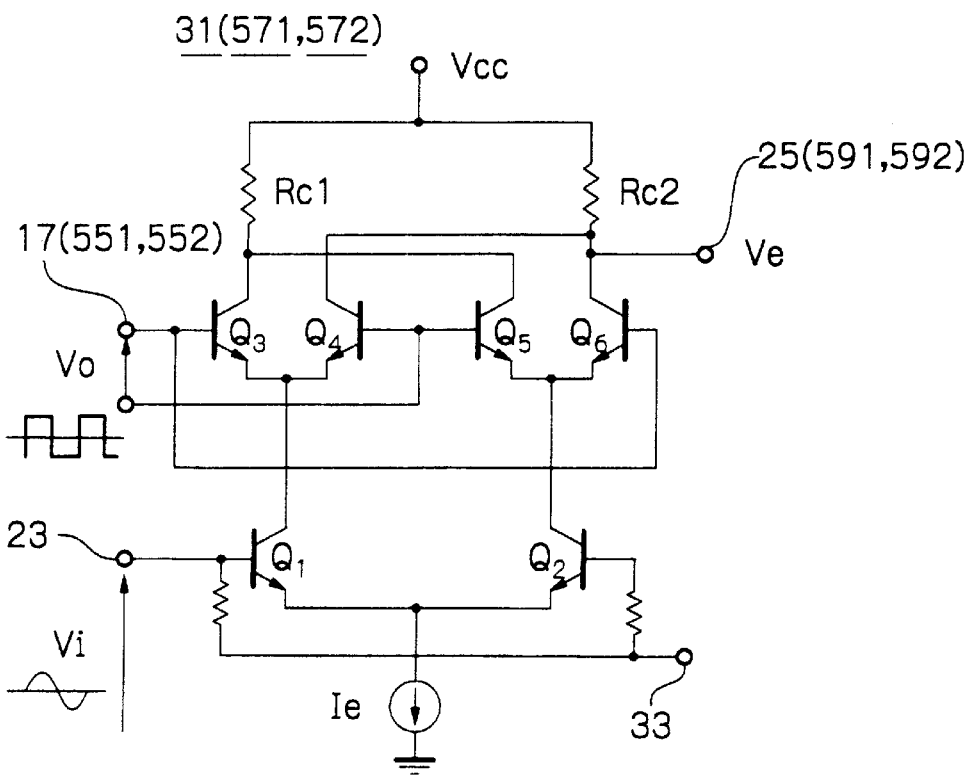
FIG. 2 shows in a schematic circuit diagram, an example of double-balancing type of phase comparator which is included in the embodiment shown in FIG. 1.

The phase comparator 12 is adapted to receive a reference voltage Vi and the voltage Vo to be controlled from an output 23 of a reference oscillator 15 and the output 17 of the voltage-controlled oscillator 11, respectively, to produce an output signal Ve on its output port 25. The phase comparator 12 includes a double-balancing type of phase comparator 31, an example of which is shown in FIG. 2, and which may be implemented in the form of analog circuitry. The double-balancing type of phase comparator 31 receives on its inputs 17 and 23 the voltage Vo to be controlled in the form of bipolar square wave and the reference voltage Vi in the form of sinusoidal wave, respectively. The phase comparator 31 includes transistors Q1 through Q6 interconnected as shown in the figure to produce the output voltage Ve on its output 25. The comparator 31 has a bias input 33 for receiving a bias voltage to the transistors Q1 and Q2.

When the bipolar voltage Vo to be controlled goes positive, the transistors Q3 and Q6 become conductive to reduce the current flowing through the one transistor Q2 by the amount equal to the current flowing through the other transistor Q1 in response to the reference voltage Vi because the emitters of the transistors Q1 and Q2 are commonly interconnected to the constant current source Ie. The output voltage Ve(+) in the period in which the voltage Vo is positive is therefore represented by $$Ve(+)=K*Vi, \quad (1)$$

where K is positive and represents the gain of the comparator 31.

When the voltage Vo to be controlled goes negative, the transistors Q4 and Q5 become conductive to convey the current flowing through the other transistor Q1 in response to the reference voltage Vi to the output resistor Rc2. The output voltage Ve(−) in the period in which the voltage Vo is negative is therefore represented by $$Ve(-)=-K*Vi. \quad (2)$$

Figure 3A:
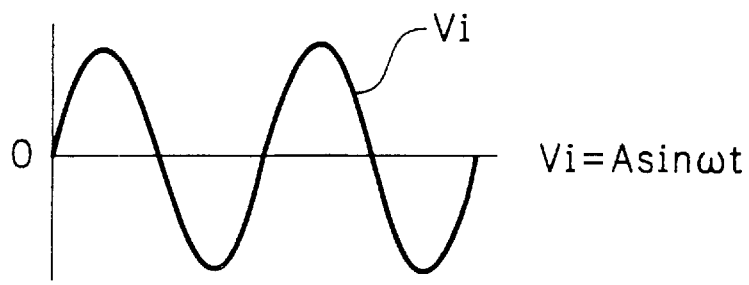
FIGS. 3A–3E show examples of the waveforms of the output voltage produced by the phase comparator shown in FIG. 2 with respect to the reference voltage and the voltage to be controlled with different phases.
Figure 3B:
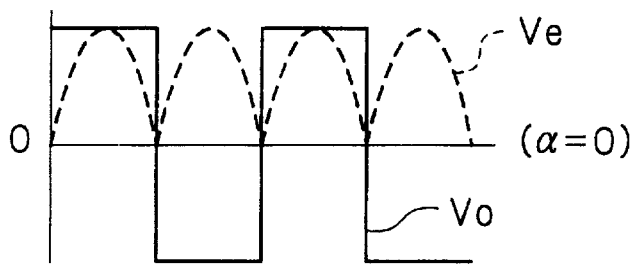
Figure 3C:
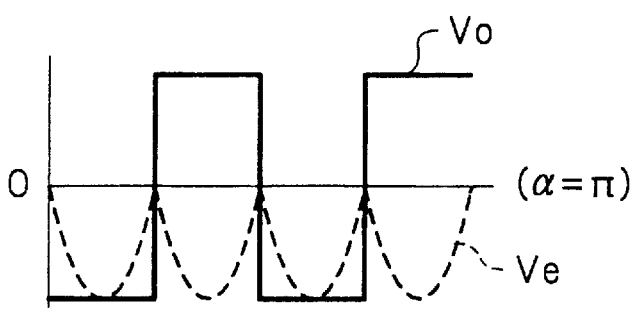
Figure 3D:
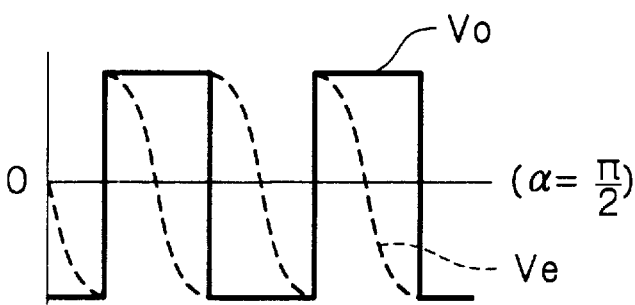
Figure 3E:
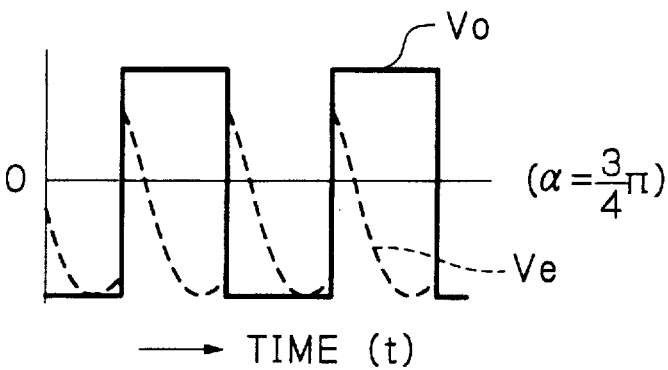

Examples of the output voltage Ve are shown in FIGS. 3A–3E with respect to the reference voltage Vi and the voltage Vo to be controlled with different phases. As shown in FIG. 3A, the reference voltage Vi takes the sinusoidal wave as represented by $$Vi=A*\sin\omega t, \quad (3)$$

where A is a constant and t represents time. FIGS. 3B–3E show the voltages Vo to be controlled with the solid lines and the output, i.e. phase difference, voltages Ve with the dotted lines in terms of the different phases α. More specifically, the voltage Vo to be controlled shown in FIG. 3B is in phase with the reference voltage Vi, namely the phase difference α=0. In FIG. 3C, the voltage Vo to be controlled is of the opposite phase against the reference voltage Vi, i.e. the phase difference α=π (radian). In FIG. 3D, the voltage Vo delays from the reference voltage Vi by the angle of π/2, i.e. α=π/2. Finally, in FIG. 3E, the voltage Vo goes higher than the reference voltage Vi around the midpoint between the positive-going edges of the voltages shown in FIGS. 3C and 3D, i.e. α=3π/4.

When the phase comparator 31 receives the reference input Vi defined by the expression (3) on its input port 23 because of the relationship between the expressions (1) and (2), the comparator 31 produces on its output port 25 the output voltage or phase difference voltage Ve defined by the expressions (4) and (5).

$$Ve=AK*\sin\omega t, \quad (4)$$

if $2N\pi-\alpha \leq \omega t < (2N+1)\pi-\alpha$, and $$Ve=-AK*\sin\omega t, \quad (5)$$

if $(2N+1)\pi-\alpha \leq \omega t < 2(N+1)\pi-\alpha$, where N represents an integer.

Now returning to FIG. 1, the loop filter 13 defines the behavior the entire system of the PLL loop 10, and is adapted to receive the phase difference voltage Ve from the phase comparator 12 on its input port 25 and average the phase difference voltage Ve during one period thereof to produce a d.c. voltage Vd representing the resultant average voltage on its output port 21. More specifically, $$dVd=(1/2\pi)*Ve*d(\omega t) \quad (6)$$

An integration of the expression (6) from 0 to $2\pi$, or in one period, with respect to $\omega t$ will deduce the expression (7).

$$Vd = (2AK/\pi) * \cos \alpha \quad (7)$$

The d.c. voltage Vd, defined by the expression (7), will be fed to the voltage-controlled oscillator 11 as the control voltage for the latter. The expression (7) reveals that the control voltage Vd is associated with the phase differenece a between the reference voltage Vi and the voltage Vo to be controlled.

Figure 4:
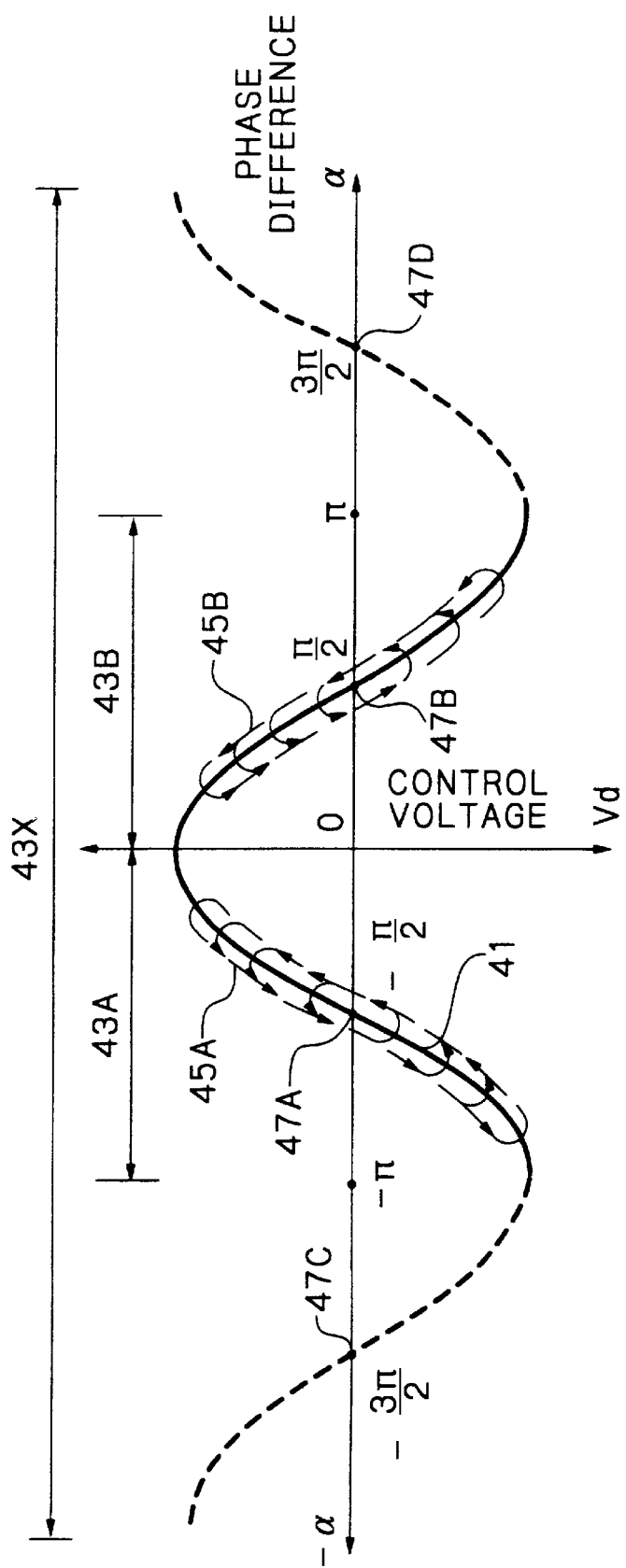
FIG. 4 plots the waveform of the control voltage appearing in the phase comparator shown in FIG. 1 and useful for understanding the relationship between the control voltage and the phase difference.

With reference to FIG. 4, the output characteristics of the double-balancing type of phase comparator 31 are represented by the cosine curve 41 with its ordinate and abscissa representing the control voltage Vd and the phase difference $\alpha$, respectively. Namely the curve 41 is plotted by the expression (7).

More specifically, in the locked range 43A extending from $-\pi$ to 0, a deviation of the phase difference $\alpha$ from the locked point 47A causes the control voltage Vd to be increased. The voltage-controlled oscillator 11 is operative in response to the control voltage Vd thus changing within the range 43A to bring the phase difference $\alpha$ to converge into a certain range centering the locked point 47A as symbolically depicted with the loops 45A through the negative feedback loop, which consists of the voltage-controlled oscillator 11, the phase comparator 12 and the loop filter 13.

In the locked range 43B, extending from 0 to $\pi$, the same negative feedback mechanism operates to bring the PLL system 10 to a certain converging range centering the locked point 47B, as depicted with the loops 45B. The PLL system 10 will take either of the locked points 47A and 47B, in which the phase differences $\alpha$ are $-\pi/2$ and $\pi/2$, respectively, depending upon the characteristics of the loop filter 13 and the voltage-controlled oscillator 11. Since the control directions are opposite to each other between the locked ranges 43A and 43B as described above, either of them has to be selected.

An extended locked range 43X covering the locked ranges 43A and 43B may be set in the double-balancing type of phase comparator 31. The locked point 47C, at $-3\pi/2$, for example, is the same in control direction as the locked point 47B, and therefore equivalent to the latter. This means that the PLL system 10 may be locked at either of the locked points 47B and 47C, and includes an infinite number of locked points.

With respect of each of the locked points 47A, etc., the locked range associated therewith extends in the phase angle of $\pi$. The double-balancing type of phase comparator 31 per se does not involve a locked range broader than $\pi$. In the prior art, the double-balancing type of phase comparator has been employed which is adapted to receive for phase comparison the frequencies into which the reference frequency and the subject frequency to be controlled are respectively divided so that the locked range is virtually expanded. In accordance with the present invention, phase changes are counted or accumulated, taking account of the direction of the phase change, to discriminate the locked points, as will be described later in detail.

Figure 5:
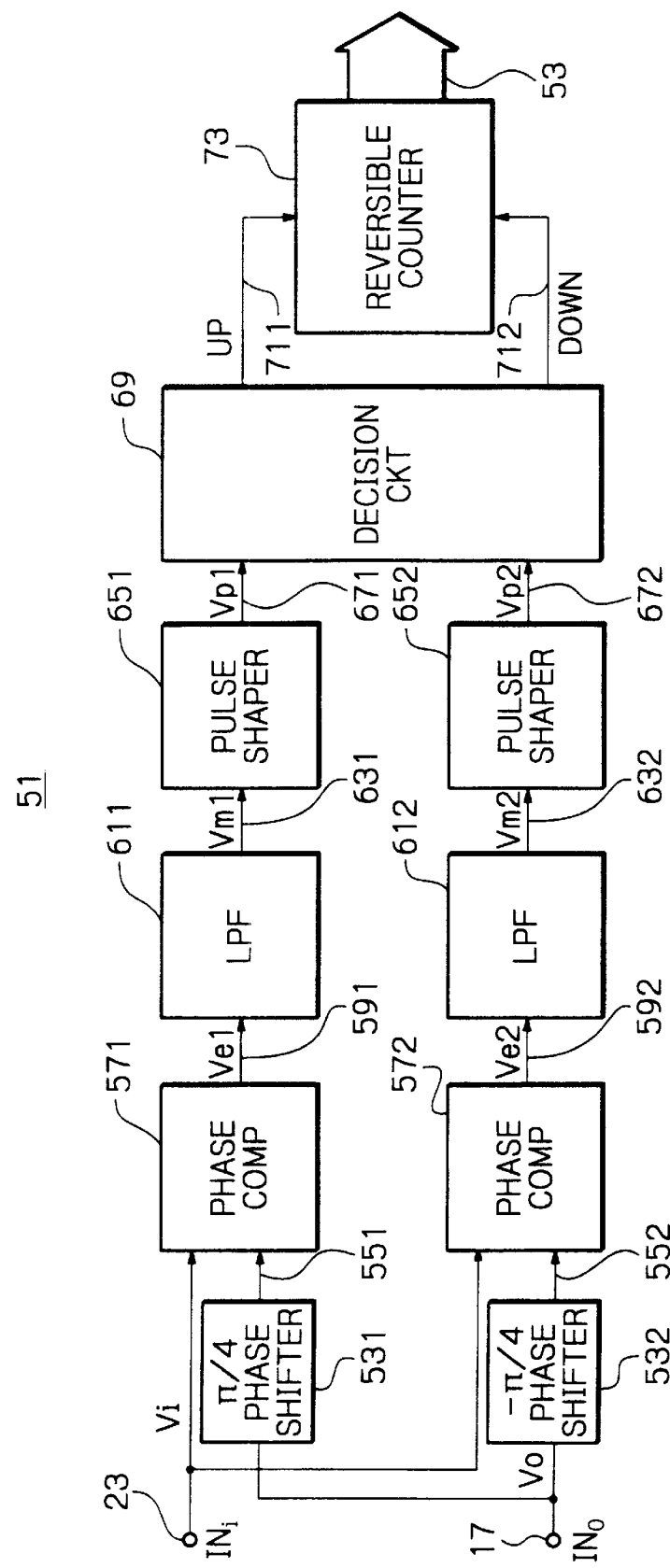
FIG. 5 is a schematic block diagram showing a preferred embodiment of a phase comparator in accordance with the present invention.
Figure 10:
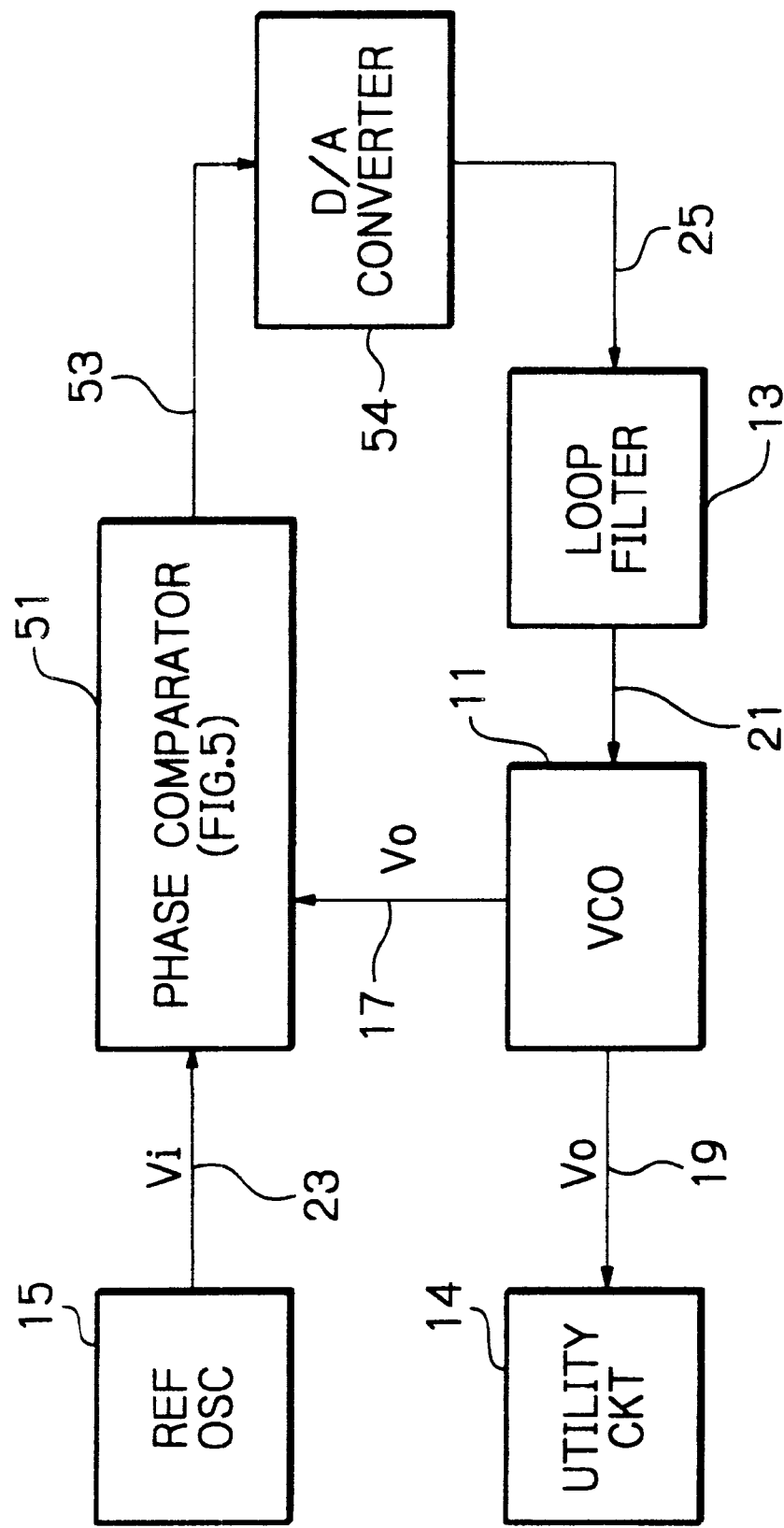
FIG. 10 is a schematic block diagram showing a preferred embodiment of a PLL circuit which includes a phase comparator in accordance with the invention.

Now with reference to FIG. 5, a preferred embodiment of the phase comparator 51 in accordance with the invention is adapted to be operative in response to the reference signal Vi on one input port 23 (INi) and the subject signal Vo to be controlled on another input port 17 (INo) to produce on an output port 53 a count that represents in which direction and to how much extent the phase of the subject signal Vo to be controlled changes. The PLL circuit 10 including the phase comparator 51 is shown in FIG. 10. In the following description, the like components are designated with the same reference numerals. The output port from the phase comparator 51 is interconnected to a digital-to-analog (D/A) converter 54, which is adapted to receive the data developed on the output port 53 to produce an analog signal corresponding thereto on its output port 25, which is in turn connected to the loop filter 13.

Well returning to FIG. 5, the phase comparator 51 includes a couple of phase shifters 531 and 532, which have a respective input interconnected to receive the subject frequency Vo to be controlled. One phase shifter 531 is adapted to shift the phase of the input frequency Vo by 45 degrees, or $\pi/4$ (radian), with respect to the period of one cycle of the input frequency Vo to produce the resultant frequency on its output 551. The other phase shifter 532 is adapted to delay the phase of the input frequency Vo by 45 degrees, or $\pi/4$, against one cycle period of the input frequency Vo to produce the resultant frequency on its output 552. The outputs 551 and 552 are coupled to phase comparator circuits 571 and 572, respectively. A signal appearing on a connection line is hereinafter referred to with a reference numeral designated on the connection line.

The phase comparator circuits 571 and 572, which may be of the same structure as each other, are adapted to compare the phases of the respective input signals 551 and 552 with the reference signal Vi received on the input port INi, and produce on respective output ports 591 and 592 thereof respective resultant voltages Ve1 and Ve2, which represent a phase difference of the input signals 551 and 552, respectively, against the reference signal Vi. The phase comparator circuits 571 and 572 may advantageously be implemented by the double-balancing type of phase comparator 31 described with reference to FIG. 2. The comparator circuits 571 and 572 have the respective output ports 591 and 592 interconnected to respective low-pass filters (LPFs) 611 and 612.

The low-pass filters 611 and 612, which may be of the same structure as each other, are adapted to filter or smooth the respective input voltages Ve1 and Ve2 to develop resultant voltages Vm1 and Vm2 on output ports 631 and 632, respectively. The filters 611 and 612 function as the loop filter 13 described with reference to FIG. 1, and the output voltages Vm1 and Vm2 may be defined by the expression (7). The output ports 631 and 632 are interconnected to respective pulse shapers 651 and 652.

The pulse shapers 651 and 652 may advantageously be of the same structure as each other and comprise a sort of filp-flop which is adapted to produce a significant output in the form of square wave Vp1 or Vp2 when the input voltage Vm1 or Vm2 exceeds a predetermined threshold set above the level "0". The pulse shapers 651 and 652 have respective outputs 671 and 672 interconnected to a decision circuit 69.

The decision circuit 69 includes an electronics logic which is adapted to receive the output voltages Vp1 and Vp2 from the respective pulse shapers 651 and 652 and determine whether the voltage Vo to be controlled is advanced or delayed in phase against the reference voltage Vi by a predetermined period to develop incremental or decremental signal UP or DOWN, respectively, on its output port 711 or 712. The decision circuit 69 is actuated at a predetermined initial phase difference $\alpha 0$, and enables the incremental output UP on its output port 711 when the phase difference $\alpha$ has the tendency to increase by the predetermined period of time, whereas enabling the decremental output DOWN on its output port 712 when the phase difference $\alpha$ has the tendency to decrease by the predetermined period of time. The output ports 711 and 712 are interconnected to a reversible or bidirectional counter 73.

The reversible counter 73 is a logic counter adapted to be responsive to the incremental and decremental inputs 711 and 712 to increment or decrement its count accordingly. A count held in the counter 73 is developed from its output port 53 in the form of parallel bits in the preferred embodiment. The provision of the decision circuit 69 for producing the incremental and decremental outputs UP and DOWN allows the reversible counter 73 to produce the appropriate output signal 53 even when the phase difference α exceeds 2π.

In the preferred embodiment, the phase comparators 571 and 572 include the double-balancing type of phase comparator 31 described with reference to FIG. 2. The one comparator 571 and the low-pass filter 611 associated therewith operate in cooperative with each other to produce the output voltage Vm1 which has been smoothed as done by the loop filter 13, FIG. 1, and is therefore defined as patterned after the expression (7). The expression (8) is therefore obtained.

$$Vm1 = M^* \cos(\alpha + \pi/4), \quad (8)$$

where $M = 2AK/\pi$. In the expression (8), the term $\pi/4$ is directed to the phase advanced by the one phase shifter 531. Similarly, the other comparator 572 and the low-pass filter 612 associated therewith operate in cooperative with each other to produce the output voltage Vm2 smoothed as done by the loop filter 13. The expression (9) is therefore obtained.

$$Vm2 = M^* \cos(\alpha - \pi/4), \quad (9)$$

The decision circuit 69 is in practice implemented into digital electronics. For mere simplicity, however, the following description will be made as if the circuitry 69 were accomplished by analog components. It is noted that the expressions (8) and (9) are represented by the cosine functions which are shifted in phase by π/2 against each other, or quadrature. The expressions (8) and (9) may be depicted in FIG. 6 on a complex plane formed by the real and imaginary axes I and Q in the form of rotary vector P.

Figures 6, 7:
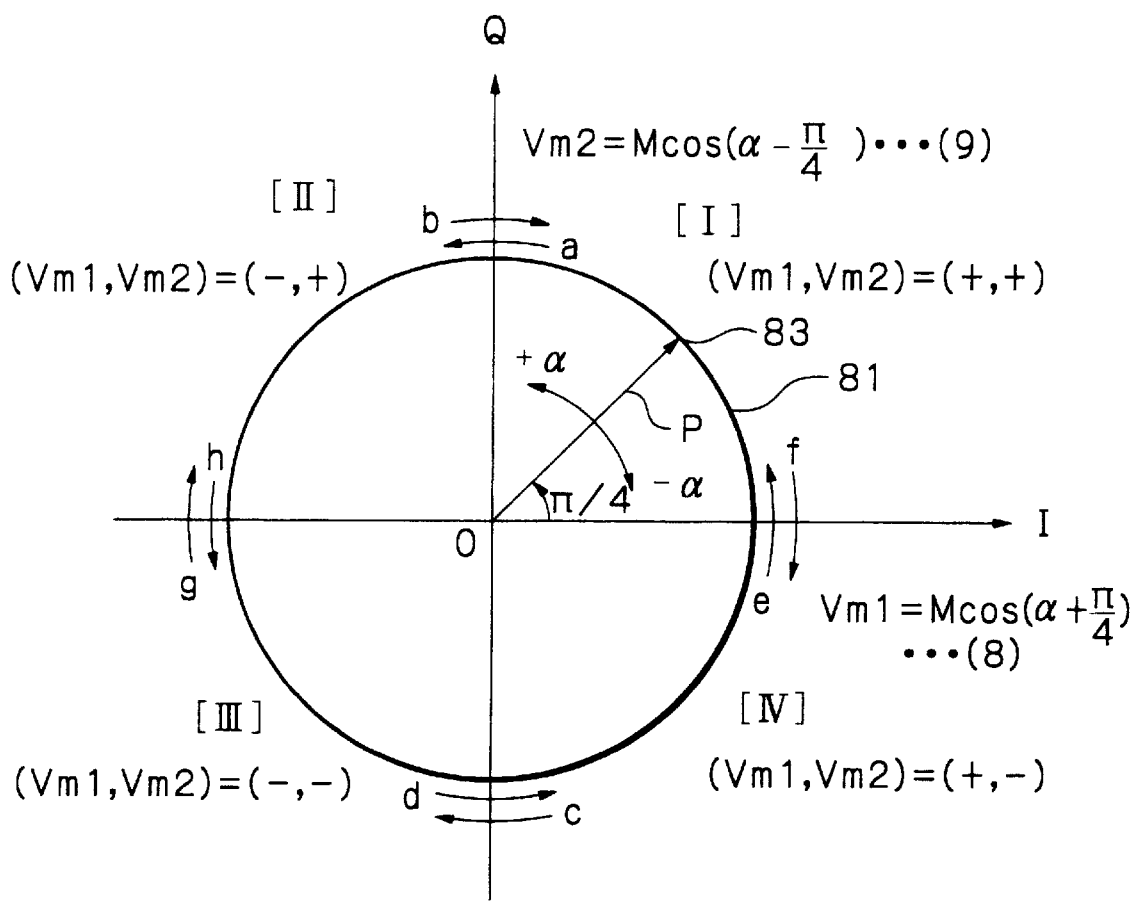
FIG. 6 shows a rotary vector formed by the output voltages from the lowpass filters in the embodiment shown in FIG. 5.
FIG. 7 shows a logic table useful for understanding a decision made by the decision circuit shown in FIG. 5 and defined by the rotary vector shown in FIG. 6.

More specifically with reference to FIGS. 6 and 7, the rotary vector P starts at the angle of π/4 from the real axis, or α=0. The angle of phase difference α takes a positive and a negative value while rotating counter-clockwise and clockwise, respectively. The decision circuit 69 watches the revolution of the vector P, and produces the incremental and decremental signals UP and DOWN when it detects the vector P passing the axis I or Q in the directions of counter-clockwise and clockwise, respectively. The bidirectional or reversible counter 73 increments or decrements in response to the incremental or decremental signal UP or DOWN, respectively. A count held in the counter 73 is therefore representative of the current, angular position of the vector P.

On the circle 81 along which the tip 83 of the vector P traces, there are four points at which the vector P crosses the axis I or Q. The directions in which the tip 83 passes the axes I and Q are denoted by the arrows a through h in the figure. The arrows a, h, d and e represent the passing of the tip 83 in the counter-clockwise direction to form a positive angle of the phase difference +α, while the arrows b, f, c and g represent the passing of the tip 83 in the clockwise direction to form a negative angle of the phase difference −α. The conditions of the passing of the tip 83 are shown in FIG. 7.

More specifically, the arrow a represents the transfer of the tip 83 from the first [I] to the second quadrant [II] of the complex plain to cross the axis Q in the counter-clockwise direction so that the one low-pass filter 611 outputs the voltage Vm1 going from positive to negative and the other low-pass filter 612 outputs the voltage Vm2 maintained positive. The decision circuit 69 in turn enables the incremental signal UP since the reversal of the sign of the voltage Vm2 occurs in the direction of +α, as is shown in FIG. 7 with the upward arrow in the column UP.

The condition b is the transfer of the tip 83 from the second [II] to the first quadrant [I] to cross the axis Q in the clockwise direction so that the one low-pass filter 611 outputs the voltage Vm1 going from negative to positive and the other low-pass filter 612 outputs the voltage Vm2 maintained positive. The decision circuit 69 in turn enables the decremental signal DOWN because the sign inversion of the voltage Vm2 occurs in the direction of −α, as shown in the figure with the downward arrow in the column DOWN.

Further, the condition h represents the transfer of the tip 83 from the second [II] to the third quadrant [III] to cross the axis I in the counter-clockwise direction so that the one low-pass filter 611 outputs the voltage Vm1 maintained negative and the other low-pass filter 612 outputs the voltage Vm2 changing from positive to negative. In response, the decision circuit 69 enables the incremental signal UP because of the sign change of the voltage Vm2 occuring in the direction of +α. The condition g is the transfer of the tip 83 from the third [III] to the second quadrant [II] to cross the axis Q in the clockwise direction so that the one filter 611 outputs the voltage Vm1 maintained negative and the other filter 612 outputs the voltage Vm2 changing from negative to positive. The decision circuit 69 therefore enables the decremental signal DOWN because the sign inversion of the voltage Vm2 occurs in the direction of −α. In the remaining lines c through h in FIG. 7, the conditions are defined by the way similar to what is described above in terms of conditions a and b.

Now referring to FIGS. 8 and 9, it will be described how the bidirectional counter 73 functions. In part (a) of FIG. 8, the analog signals of voltage Vm1 and Vm2 are plotted with the abscissa and the ordinate representing the phase difference α and the voltage Vm, respectively. The dotted and solid lines of the sinusoidal curves represent voltages Vm1 and Vm2, respectively. On the abscissa, or horizontal axis, the eight conditions a through h are depicted with the dots with the arrows. Part (b) of FIG. 8 shows the digital signals of voltage Vp1 and Vp2 with dotted and solid lines, respectively. FIG. 9 shows the rotary vector P in the manner similar to that of FIG. 6, and the corresponding quadrants are also indicated in part (b) of FIG. 8 with the Roman numerals between the brackets.

Reference points P0(α)–Pn(α) are set up with every the angle of π/2, where n is a natural number. For example, the condition a is defined as the point P0(π/4) which is passed by the phase difference α in the direction in which the difference α increases. The condition b is defined as the point P0(π/4) passed by the phase difference α in the direction in which the difference α decreases.

Similarly, the conditions h, d and e are defined as the points P1(3π/4), P2(5π/4) and P3(7π/4) passed by the phase difference α in the direction in which the difference α increases. The conditions g, c and f are defined as the points P1(3π/4), P2(5π/4) and P3(7π/4) passed by the phase difference α in the direction in which the difference α decreases.

In operation, when the phase difference α starts at the reference point P0 and changes so that the decision circuit 69 generates the incremental and decremental signals UP and DOWN in accordance with the truth table shown in FIG. 7 whenever the phase difference α passes any of the reference points P0–Pn. The bidirectional or reversible counter 73 increments or decrements accordingly so that a count held therein represents how large, i.e. where the phase difference α is. In other words, the current position of the vector P is obtained accordingly, and therefore the phase comparator 51 does not has to be designed such that the current position of the vector P is restricted within the range centering the reference point P0 and extending ±π. This means that the locked range may be expanded to any extent as desired, or infinitely.

The part (b), FIG. 8, shows the waveforms of the voltages Vp1 and Vp2 shaped by the pulse shapers 651 and 652, respectively. The voltages Vp1 and Vp2 are equivalent to the waveforms resultant from respectively amplifying the analog voltages Vm1 and Vm2 lowpass-filtered with an extensive amplification factor and clipping the amplified voltages with a predetermined clipping level. This means therefore that the above description of the decision circuit 69 in terms of the analog voltages Vm1 and Vm2 is exactly applicable to the digital signals Vp1 and Vp2.

FIG. 9 is a vector chart showing both the analog signals Vm1 and Vm2 and the digital signals Vp1 and Vp2 on the common plane. The analog signals Vm1 and Vm2 trace the circle 18 which centers the origin Q0 and has the radius M as discussed above. On the other hand, the digital signals Vp1 and Vp2 stay either of the four points Q1–Q4.

More specifically, in the first quadrant [I], or $-\pi/4 \leq \alpha < \pi/4$, the digital signals Vp1 and Vp2 stay the point Q1, at which (Vp1, Vp2)=(1, 1). In the second quadrant [II], or $\pi/4 \leq \alpha < 3\pi/4$, the digital signals Vp1 and Vp2 stay the point Q2, at which (Vp1, Vp2)=(0, 1). In the third quadrant [III], or $3\pi/4 \leq \alpha < 5\pi/4$, the digital signals Vp1 and Vp2 stay the point Q3, at which (Vp1, Vp2)=(0, 0). Finally, in the fourth quadrant [IV], namely $5\pi/4 \leq \alpha < 7\pi/4$, the digital signals Vp1 and Vp2 stay the point Q4, at which (Vp1, Vp2)=(1, 0). Those conditions are also shown in part (b), FIG. 8, in which the first quadrant includes (Vp1, Vp2)=(1, 1), the second quadrant includes (Vp1, Vp2)=(0, 1), and so on.

The above description clarifies that it may be determined from identifying in which of the quadrants the digital signals Vp1 and Vp2 stay presently and at the immediately preceding time section or step, i.e. one clock period before, whether to increment or decrement the reversible counter 73. For example, the signals Vp1 and Vp2 stay presently in the second quadrant following the first quadrant, so that the decision circuit 69 generates the increment signal UP to the reversible counter 73. When the signals Vp1 and Vp2 stay now in the second quadrant following the third quadrant, the decision circuit 69 generates the decremental signal DOWN to the counter 73. If the signals Vp1 and Vp2 stay in the second quadrant in the successive two time sections, then the bidirectional counter 73 does not update its count. If the signals Vp1 and Vp2 stay now in the second quadrant following the fourth quadrant, the decision circuit 69 determines error.

In operation, the reference voltages Vi, generated by the reference oscillator 15 is received by the couple of phase comparators 571 and 572, while the voltages Vo to be controlled supplied from the voltage-controlled oscillator 11 is received by the couple of phase shifters 531 and 532 to be shifted in phase by $\pi/4$ and $-\pi/4$, respectively. The phase-shifted signals are fed to the input ports 551 and 552 of the phase comparator circuits 571 and 572, respectively.

The phase comparator circuits 571 and 572 in turn compare the phases of the respective input signals 551 and 552 with the reference signal Vi received on the input port 23 to produce the respective resultant voltages Ve1 and Ve2 on the respective output ports 591 and 592. The operation of the phase comparator circuits 571 and 572, comprising the double-balancing type of phase comparator 31, is the same as described earlier with reference to FIG. 2. The resultant voltages Ve1 and Ve2, representing a phase difference of the input signals 551 and 552, respectively, against the reference signal Vi, are delivered to the low-pass filters 611 and 612, respectively.

The low-pass filters 611 and 612 respectively filter or smooth the input voltages Ve1 and Ve2 to produce the resultant voltages Vm1 and Vm2 defined by the expressions (8) and (9) on the output ports 631 and 632 thereof. The output voltages 631 and 632 are supplied to to the pulse shapers 651 and 652, respectively.

The pulse shapers 651 and 652 respectively convert the analog voltages Vm1 and Vm2 into square waves or digital signals Vp1 and Vp2 by respectively amplifying the analog voltages Vm1 and Vm2 with a large amplification factor and clipping the amplified voltages with a predetermined clipping level, for example. The resultant digital voltages Vp1 and Vp2 are transferred to the decision circuit 69.

Figure 11:
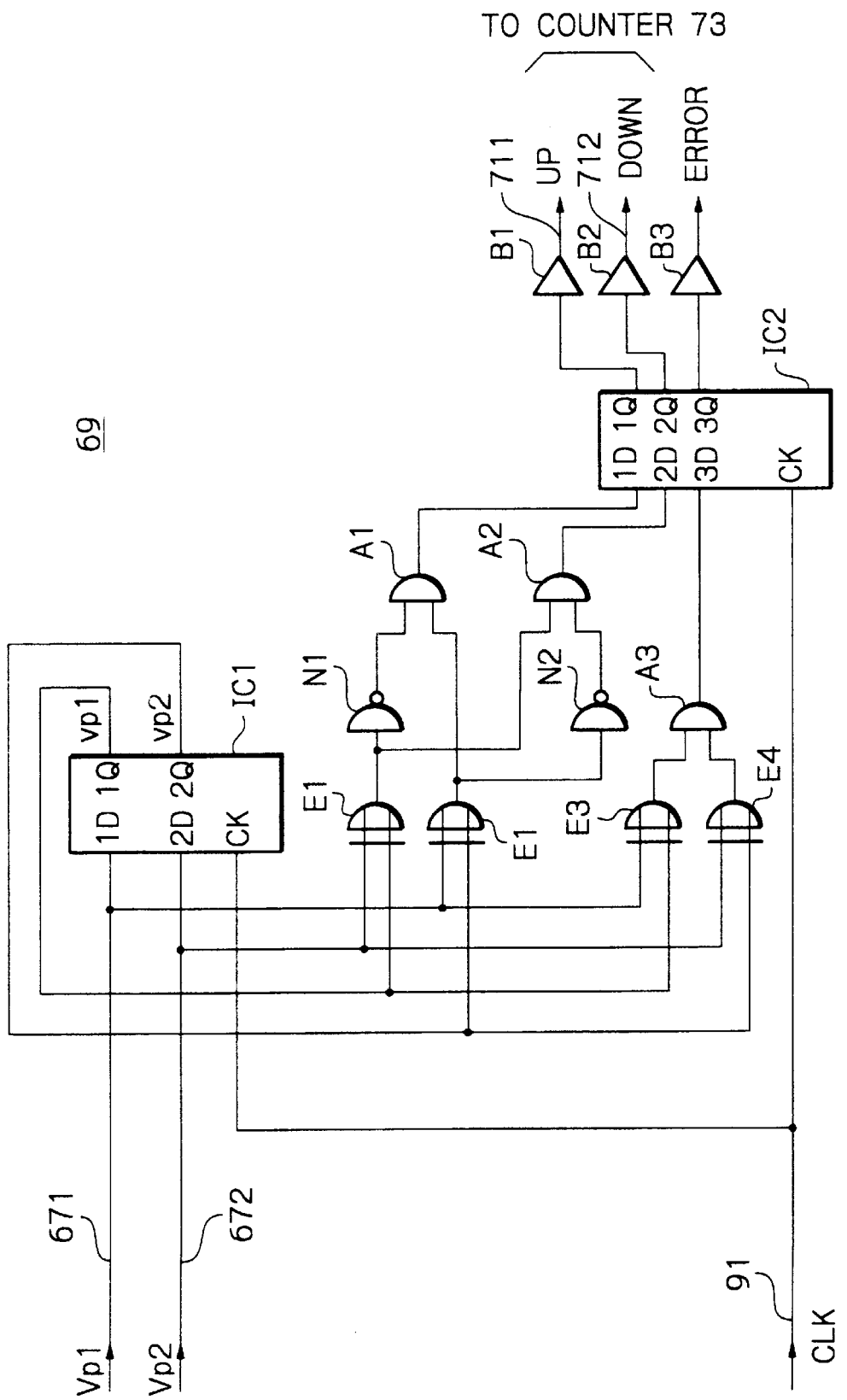
FIG. 11 shows in a schematic circuit diagram an embodiment of the decision circuit shown in FIG. 5.

In the specific embodiment, the decision circuit 69 may advantegeously comprise, with reference to FIG. 11, a D type of flip-flop IC1, a pulse holding circuit IC2, exclusive OR gates E1–E4, NAND gates N1 and N2, AND gates A1, A2 and A3, and buffer amplifiers B1, B2 and B3, which are connected as shown in the figure to receive the output voltages Vp1 and Vp2 and determine whether the voltage Vo to be controlled is advanced or delayed in phase with respect to the reference voltage Vi to produce the incremental or decremental signal UP or DOWN accordingly on its output port 711 or 712.

More specifically, the D type flip-flop IC1 is a kind of delay circuit adapted to be operative in response to clock signals CLK fed on a connection 91 to its terminal CK and hold the logical state defined by the input voltages Vp1 and Vp2 received on its ports 1D and 2D, respectively, to enable its output ports 1Q and 2Q accordingly after one cycle period of the clock signal CLK. It is recalled that it is determined from identifying in which of the quadrants the digital signals Vp1 and Vp2 stay presently, and stayed one clock period or interval before, whether to increment or decrement the reversible counter 73. The decision circuit 69 is adapted to determine the logical states of the present signals Vp1 and Vp2 on its input ports 671 and 672 as well as of the previous signals vp1 and vp2 on the output ports 1Q and 2Q of the filp-flop IC1, respectively.

The logical determination is implemented by the logic circuitry which includes the exclusive OR gates E1–E4, NAND gates or inverters N1 and N2, and AND gates A1, A2 and A3 connected as shown in the figure, and of which the truth table is shonw in FIG. 12. The pulse hold circuit IC2 is adapted to be responsive to the clock signals CLK received on its terminal CK and temporarily hold the logic signals develped from the AND gates A1, A2 and A3.

On the truth table, FIG. 12, the leftmost three columns indicate the current state of the input voltages Vp1 and Vp2, in other words, the logical conditions of the input signals 1D and 2D of the flip-flop IC1. The central three columns indicate the state of the output voltages vp1 and vp2 on the output ports 1Q and 2Q, respectively, in other words, the logical conditions of the input volgates Vp1 and Vp2 which are received by the flip-flop IC1 one period, or clock interval, of the clock signal CLK before. The rightmost three columns indicate the logical conditions of the output signals, UP, DOWN and ERROR, from the pulse holding circuit IC2.

More specifically, the top line on the truth table defines (Vp1, Vp2)=(1, 1) and (vp1, vp2)=(1, 1). This means that both of the current and previous states of the input voltages Vp1 and Vp2 stay in the first quadrant, thus disabling the incremental and decremental outputs UP and DOWN. The second line defining (Vp1, Vp2)=(0, 1) and (vp1, vp2)=(1, 1) describes that the current state of the input voltages Vp1 and Vp2 stays in the second quadrant and the previous state was of the first quadrant. This means that the phase difference α has increased from the first quadrant, thus enabling the incremental output UP. The third line defines (Vp1, Vp2)=(0, 0) and (vp1, vp2)=(1, 1). The current state of the input voltages Vp1 and Vp2 stays in the third quadrant and the previous state was of the first quadrant. This indicates the second quadrant is skipped so that the changing is discontinued, thus enabling the error output ERROR. The fourth line from the top defines (Vp1, Vp2)=(1, 0) and (vp1, vp2)=(1, 1) to describe that the current state of the input voltages Vp1 and Vp2 stays in the fourth quadrant and the previous state was of the first quadrant. This means that the phase difference α has decreased from the first quadrant, thus enabling the decremental output DOWN. The remaining lines could be explained in a similar way.

Figures 13A, 13B, 13C:
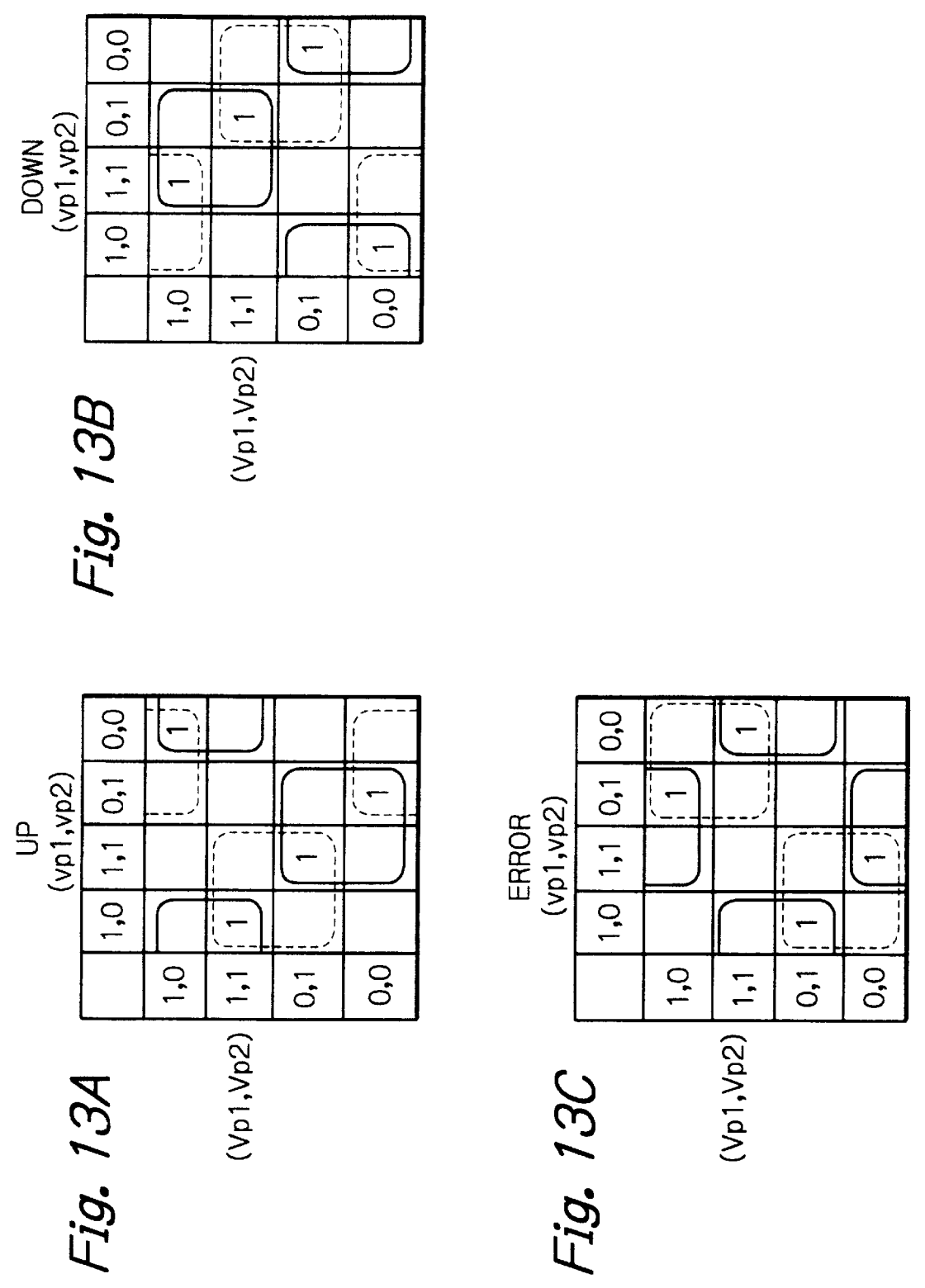

A logic circuit accomplishing the truth table shown in FIG. 12 may be designed as exemplified in FIG. 11. FIGS. 13A, 13B and 13C show examples of the Karnaugh maps useful for designing the logic circuit directed to the decision circuit 69 of the embodiment. FIGS. 13A, 13B and 13C are respectively directed to the incremental, decremental and error decisions UP, DOWN and ERROR. On the maps, the horizontal raws denote the output state (vp1, vp2) while the virtical columns denote the input state (Vp1, Vp2).

More specifically, in FIG. 12, the second raw indicates (Vp1, Vp2)=(0, 1) and (vp1, vp2)=(1, 1) as described above. That condition corresponds in FIG. 13A to the crosspoint by the third raw from the top and the second column from the left, and the incremental decision UP is therefore denoted as logical "1" at the crosspoint on the map. In the similar manner, the remaining output conditions in the rightmost three columns on the truth table shown in FIG. 12 are denoted at the remaining crosspoints on the Karnaugh maps as shown in FIGS. 13A, 13B and 13C.

The logical structure denoted on the maps allows the decision circuit 69 performing the truth table shown in FIG. 12 to be designed in the form of exclusive OR gates. The exemplified circuitry shown in FIG. 11 is thus designed including the inverters N1 and N2, and AND gates A1, A2 and A3 also. The specific structure of the decision circuit 69 includes the pulse holding circuit IC2, by which the decision signals UP, DOWN and ERROR are temporarily held therein, and developed in response to the clock signal CLK through the buffers B1, B2 and B3 associated therewith. The decision signals UP and DOWN are transferred to the corresponding inputs to the reversible counter 73. The signal ERROR is available for a utitity circuit, such as an alarm device, adapted to alert a service person of the erronous condition. Any transient noises likely to be involved in the leading and trailing edges of the pulse signals can be removed by the pulse holding circuit IC2.

The sepcific circuit structure of the decision circuit 69 is thus adapted to simultaneously watch the present input signals Vp1 and Vp2 and the previous, or output, signals vp1 and vp2 to determine whether the phase difference α increases or decreases by the flip-flop IC1. The decision circuit 69 is thus simplified in structure and inexpensive. Noises that could influence peripheral circuitry such as the utility circuit 14 will be discriminated to produce the explicit signal ERROR.

Figure 14:
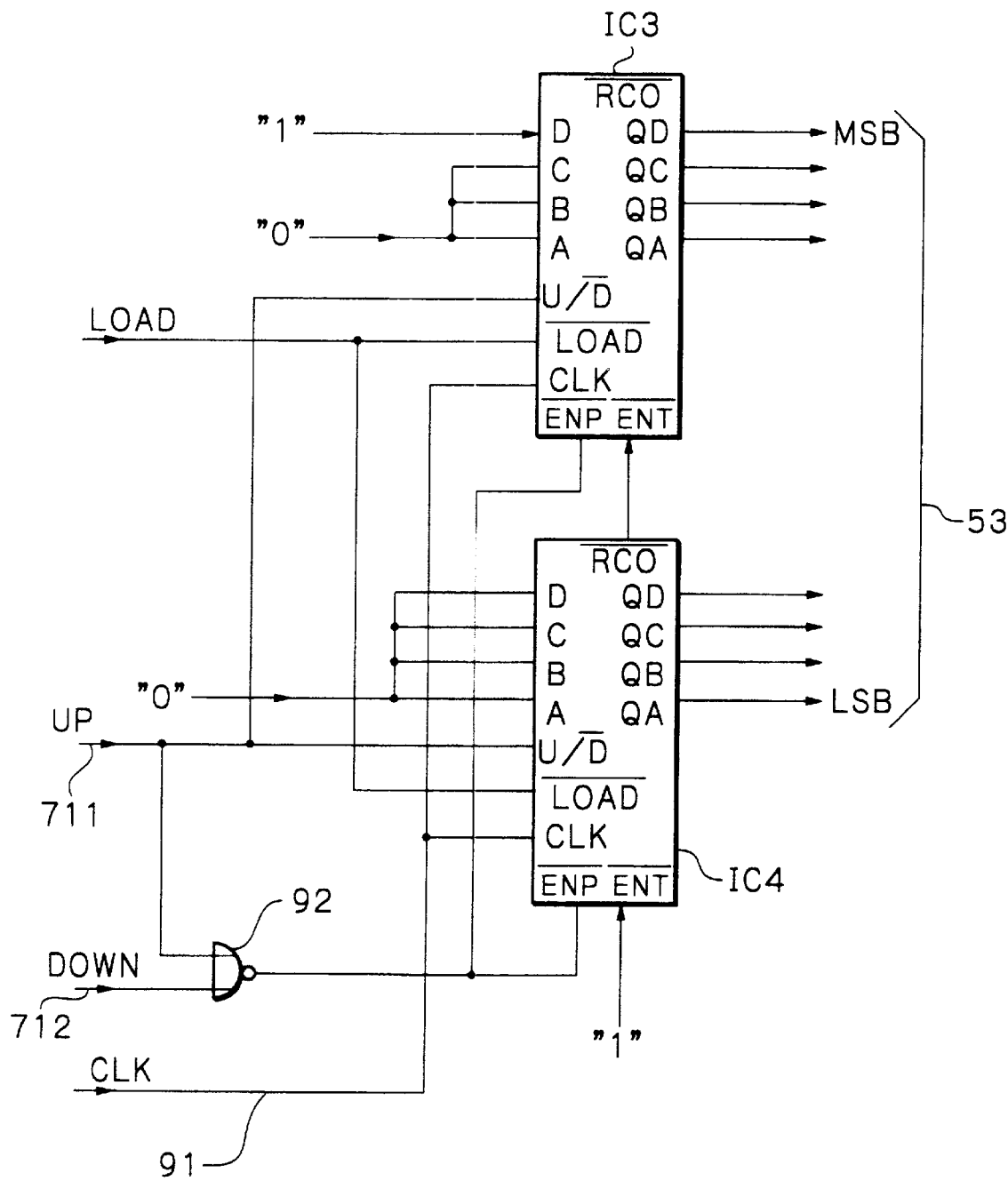
FIG. 14 shows in a schematic circuit diagram a specific example of the reversible counter in the embodiment shown in FIG. 5.

Now referring to FIG. 14, a specific example of the reversible or bidirectional counter 73 includes counters IC3 and IC4, and an OR gate 92, which are connected as shown in the figure to be responsive to the incremental and decremental inputs 711 and 712 to increment or decrement its count accordingly, which will be developed in the form of parallel, eight bits on the output port 53. The counters IC3 and IC4, which may be of the same type, are a synchronously driven type of four-bit binary reversible counter, such as model 74ALS169B commercially available from Texas Instruments, Inc. The couple of counters IC3 and IC4 operate in timed with the clock signal CLK on its terminal CLK in synchronous with the operation of the decision circuit 69 to increment or decrement in response to the decision signal UP or DOWN.

In summary, the reversible counter 73 accumurates the pulses UP and DOWN from the start point so that a count held in and developed from its output port 53 represents where the voltages Vp1 and Vp2 currently stay, in other word, where the voctor P is present on the vector plane as shown in FIG. 9. The start point may appropriately be set up in a device in which the phase comparator 51 is included, such as the PLL circuit 10 in accordance with the specific embodiment, by designing the circuit conditions thereof or the parameters for a kick circuit, which is adapted for setting up the start voltage which is applied, when starting the PLL circuit 10, to the voltage-controlled oscillator 11 included in the PLL circuit 10.

The preferred embodiment of the phase comparator thus comprises the decision circuit 69 which is adapted to determine whether the phase difference α of the signal Vo to be controlled from the reference signal Vi is increased or decreased on the basis of the rotary vector P representative of the digital voltage Vp in terms of the phase differnce α. The reversible counter 73 increments or decrements its count in dependence upon the determination made by the decision circuit 69, thus allowing the phase difference α to be measured over a period of time longer than the one cycle period of the voltage Vo to be controlled.

An application of the phase comparator thus structured to a PLL circuit will allow the range in which the phase is compared to be set wider, thus accomplishing the PLL circuit available for higher frequency without requiring a frequency divider as done in the prior art. The removal of a fequency divider from a PLL circuit results in reducing the size and the power consumed of the entire PLL circuitry as well as improving the control response, and hence reducing a jitter involved in an output signal from the circuitry, due to the fact that a response time required for obtaining a result from the phase comparison is shorter that a PLL circuit including a frequency divider.

The entire desclosure of Japanese patent application No. 96823/1998 filed on Mar. 25, 1998 including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiments without departing from the scope and spirit of the present invention.

What is claimed is:

1. A phase comparator for comparing a phase of a subject signal with a phase of a reference signal for producing a result signal representative of a result therefrom, comprising:
   a first phase shifter for advancing the phase of the subject signal by a predetermined angle to produce a first signal, the predetermined angle being substantially equal to $\pi/4$;

a second phase shifter for delaying the phase of the subject signal by the predetermined angle to produce a second signal;

a first phase comparator circuit for comparing a phase of the first signal with the phase of the reference signal during a plurality of periods of the reference signal or the first signal to obtain a phase difference in each of the plurality of periods to produce a first phase difference signal representative of the phase difference obtained;

a second phase comparator circuit for comparing a phase of the second signal with the phase of the reference signal during a plurality of periods of the reference signal or the second signal to obtain a phase difference in each of the plurality of periods to produce a second phase difference signal representative of the phase difference obtained;

a decision circuit operative in response to the first and second phase difference signals for determining whether the phase of the subject signal changes in a first direction in which the phase difference increases or in a second direction in which the phase difference decreases; and a reversible counter operative in response to said decision circuit for incrementing or decrementing a count to produce the result signal corresponding to the count.

2. The phase comparator in accordance with claim 1, wherein said decision circuit determines the first and second directions in such a manner that, on a complex plain formed by a real axis defined by one of the first and second signals and an imaginary axis defined by the other of the first and second signals and having four quadrants, when a vector defined by the first and second signals moves from one of the quadrants to any other of the quadrants, the first direction is determined, while, when the vector moves the other quadrant to the one quadrant, the second direction is determined.

3. The phase comparator in accordance with claim 1, wherein said decision circuit comprises:

a delay circuit for receiving the first and second phase difference signals and delaying the first and second phase difference signals by a predetermined period of time to produce a third and a fourth signal, respectively; and a comparator circuit for comparing the first and second phase difference signals with the third and fourth signals to determine whether the phase of the subject signal changes in the first or second direction.

4. The phase comparator in accordance with claim 3, further comprising a digitizing circuit for digitizing the first and second phase difference signals to produce the first and second phase difference signals, respectively, in a digital form;

said delaying circuit delaying the first and second phase difference signals in the digital form by a period of one cycle of a clock to produce the third and fourth signals;

said comparator circuit comprising logic circuitry operative in response to the clock for comparing the first and second phase difference signals with the third and fourth signals, respectively.

5. The phase comparator in accordance with claim 4, wherein said logic circuitry produces an error signal representing an erroneous condition when said logic circuitry fails to determine in which of the first and second directions the phase of the subject signal changes.

6. The phase comparator in accordance with claim 4, wherein said decision circuit further comprises a pulse holding circuit for receiving and temporarily holding an output form said logic circuitry, and then producing the output thus held to said reversible counter.

7. The phase comparator in accordance with claim 1, further comprising:

a first low-pass filter for smoothing the first phase difference signal to deliver the first phase difference signal smoothed to said decision circuit; and a second low-pass filter for smoothing the second phase difference signal to deliver the second phase difference signal smoothed to said decision circuit.

8. The phase comparator in accordance with claim 1, wherein each of said first and second phase comparator circuits comprise a double-balancing type of phase comparator.

9. A phase-locked loop comprising:

a reference oscillator for generating a reference signal;

a phase comparator for comparing a phase of a subject signal with a phase of the reference signal for producing a result signal representative of a result therefrom; and a voltage-controlled oscillator operative in response to the result signal for producing the subject signal having a frequency dependent upon the result signal;

said phase comparator comprising:

a first phase shifter for advancing the phase of the subject signal by a predetermined angle to produce a first signal, the predetermined angle being substantially equal to $\pi/4$;

a second phase shifter for delaying the phase of the subject signal by the predetermined angle to produce a second signal;

a first phase comparator circuit for comparing a phase of the first signal with the phase of the reference signal during a plurality of periods of the reference signal or the first signal to obtain a phase difference in each of the plurality of periods to produce a first phase difference signal representative of the phase difference obtained;

a second phase comparator circuit for comparing a phase of the second signal with the phase of the reference signal during a plurality of periods of the reference signal or the second signal to obtain a phase difference in each of the plurality of periods to produce a second phase difference signal representative of the phase difference obtained;

a decision circuit operative in response to the first and second phase difference signals for determining whether the phase of the subject signal changes in a first direction in which the phase difference increases or in a second direction in which the phase difference decreases; and a reversible counter operative in response to said decision circuit for incrementing or decrementing a count to produce a numerical signal corresponding to the count;

said phase-locked loop further comprising:

a digital-to-analog converter for receiving the numerical signal and for converting the numerical signal to an analog signal corresponding to the numerical signal to produce an analog phase difference signal; and a loop filter for filtering the analog phase difference signal to produce the result signal characterizing a response of the subject signal to changes of the phase difference.

* * * * *